US012787489B2

(12) United States Patent
Zhao et al.

(10) Patent No.: US 12,787,489 B2
(45) Date of Patent: Nov. 3, 2026

(54) SOLAR CELL AND PHOTOVOLTAIC MODULE

(71) Applicant: JINKO SOLAR (HAINING) CO., LTD., Haining City (CN)

(72) Inventors: Zijie Zhao, Haining City (CN); Shiliang Huang, Haining City (CN); Zhiqiu Guo, Haining City (CN)

(73) Assignee: JINKO SOLAR (HAINING) CO., LTD., Haining (CN)

( * ) Notice: Subject to any disclaimer, the term of this patent is extended or adjusted under 35 U.S.C. 154(b) by 23 days.

(21) Appl. No.: 18/415,532

(22) Filed: Jan. 17, 2024

(65) Prior Publication Data

US 2024/0186425 A1 Jun. 6, 2024

Related U.S. Application Data

(63) Continuation of application No. PCT/CN2023/123786, filed on Oct. 10, 2023.

(30) Foreign Application Priority Data

Dec. 6, 2022 (CN) ......................... 202223317662.0

(51) Int. Cl.

| | |
|---|---|
| ***H10F 77/00*** | (2025.01) |
| ***H10F 10/14*** | (2025.01) |
| ***H10F 77/20*** | (2025.01) |

(52) U.S. Cl.

CPC ......... *H10F 77/937* (2025.01); *H10F 10/146* (2025.01); *H10F 77/219* (2025.01)

(58) Field of Classification Search

None

See application file for complete search history.

(56) References Cited

U.S. PATENT DOCUMENTS

2017/0170338 A1 6/2017 Matsuo et al.
2021/0249549 A1* 8/2021 Gaume .................. H10F 19/80

FOREIGN PATENT DOCUMENTS

CN 103426940 A 12/2013
CN 106575679 A 4/2017

(Continued)

OTHER PUBLICATIONS

Machine translation of CN 215988787 U (Year: 2022).*

(Continued)

*Primary Examiner* — Tamir Ayad

(74) *Attorney, Agent, or Firm* — USCH Law, PC

(57) ABSTRACT

A first surface of the solar cell has multiple first electrodes and multiple second electrodes staggered in an interdigitated pattern. Each of the multiple first electrodes has a first busbar and multiple first fingers, and each of the multiple second electrodes has a second busbar and multiple second fingers extending along the second direct. A first welding point is defined on the first busbar, and a second welding point is defined on the second busbar. The solar cell further includes multiple insulation structures. Each of the multiple insulation structures extends to cover ends of the multiple first fingers. A window is opened on a projection of at least one of the first busbar and the first welding point on a respective insulation structure, and/or a window is opened on a projection of at least one of the second busbar and the second welding point on the respective insulation structure.

10 Claims, 2 Drawing Sheets

(56) References Cited

FOREIGN PATENT DOCUMENTS

| | | | |
|---|---|---|---|
| CN | 111883606 | A | 11/2020 |
| CN | 212848425 | U | 3/2021 |
| CN | 213459752 | U | 6/2021 |
| CN | 215988781 | U | 3/2022 |
| CN | 215988782 | U | 3/2022 |
| CN | 215988784 | U | 3/2022 |
| CN | 215988787 | U | 3/2022 |
| CN | 114512553 | A | 5/2022 |
| CN | 216958062 | U | 7/2022 |
| CN | 114899251 | A | 8/2022 |
| CN | 217405442 | U | 9/2022 |
| CN | 115172484 | A | 10/2022 |
| CN | 218069862 | U | 12/2022 |
| CN | 218918904 | U | 4/2023 |
| JP | 2014229736 | A | 12/2014 |
| JP | 2015512563 | A | 4/2015 |
| JP | 2018011073 | A | 1/2018 |
| JP | 2021190641 | A | 12/2021 |
| JP | 2022087356 | A | 6/2022 |
| JP | 2023033059 | A | 3/2023 |
| KR | 20150055507 | A | 5/2015 |
| KR | 20210069438 | A | 6/2021 |

OTHER PUBLICATIONS

Machine translation of KR 20150055507A (Year: 2015).*

Jinko Solar (Haining) Co., Ltd., First Office Action, GB 2400979.7, Mar. 11, 2024, 6 pgs.

Jinko Solar (Haining) Co., Ltd., Extended European Search Report, EP 23841174.8, Oct. 8, 2024, 144 pgs.

Jinko Solar (Haining) Co., Ltd., JP First Office Action with English Translation, JP 2024-501962, Mar. 14, 2025, 9 pgs.

Jinko Solar (Haining) Co., Ltd., KR Notice of Allowance with English Translation, KR 10-2024-7004262, Apr. 7, 2025, 4 pgs.

Jinko Solar (Haining) Co., Ltd., AU Second Office Action, AU 2023312379, Jun. 12, 2025, 5 pgs.

* cited by examiner

SOLAR CELL AND PHOTOVOLTAIC MODULE

CROSS-REFERENCE TO RELATED APPLICATION

The present application is a continuation of PCT Patent Application No. PCT/CN2023/123786, entitled "SOLAR CELL AND PHOTOVOLTAIC MODULE," filed Oct. 10, 2023, which claims priority to Chinese patent application No. 202223317662.0, entitled "SOLAR CELL AND PHOTOVOLTAIC MODULE," filed Dec. 6, 2022, each of which is incorporated by reference herein in its entirety.

TECHNICAL FIELD

The present application relates to the technical field of photovoltaics, and in particular to a solar cell and a photovoltaic module.

BACKGROUND

In an interdigitated back contact (IBC) solar cell, positive metal electrodes and negative metal electrodes of the solar cell are arranged in an interdigitated pattern on the rear surface of the solar cell, and are closely arranged around busbars and welding points. Therefore, there is a risk of short circuit of the solar cell during the welding process of welding strips, which leads to short circuit of the components.

SUMMARY

In view of this, a solar cell and a photovoltaic module are provided according to the present application, to avoid short circuits in the solar cell.

In a first aspect, the present application provides a solar cell, including:

- multiple first electrodes and multiple second electrodes on a first surface of the solar cell, each of the multiple first electrodes has a first busbar extending along a first direction and multiple first fingers extending along a second direction, each of the multiple second electrodes has a second busbar extending along the first direction and multiple second fingers extending along the second direction, and the first direction is perpendicular to the second direction, the first busbar having a first welding point, and the second busbar having a second welding point; wherein the multiple first fingers in a respective first electrode and the multiple second fingers in a respective second electrode are staggered in an interdigitated pattern; and
- multiple insulation structures including first insulation structures and/or second insulation structures, a respective first insulation structure being configured to cover an area near a respective first busbar and ends of multiple second fingers close to the first busbar, a respective second insulation structure being configured to cover an area near a respective second busbar and ends of the multiple first fingers close to the respective second busbar;
- where the respective first insulation structure leaves open a window corresponding to a projection of at least one of the respective first busbar and the first welding point of the respective first busbar; and
- where the respective second insulation structure leaves open a window corresponding to a projection of at least one of the respective second busbar and the second welding point of the respective second busbar.

In an embodiment, each of the multiple insulation structures includes a first insulation portion and a second insulation portion, and the first insulation portion and the second insulation portion are arranged on opposite sides of the first busbar and/or the second busbar.

In an embodiment, the first insulation portion and the second insulation portion extend along the first direction, and there is a first distance d1 between the first insulation portion and the first busbar and between the second insulation portion and the second busbar along the second direction, and 0.2 mm≤d1≤0.4 mm.

In an embodiment, the first insulation portion and the second insulation portion have a first width L1 along the second direction, and 0.9 mm≤L1≤1.1 mm.

In an embodiment, each of the multiple insulation structures is configured to cover ends of the multiple first fingers close to the second welding point and/or ends of the second finger close the first welding point, and the first insulation portion and second insulation portion are arranged on opposite sides of the first welding point and/or the second welding point.

In an embodiment, the first busbar and the second busbar are evenly spaced along the second direction, and there is a second distance d2 between the first busbar and an adjacent second busbar, and 9 mm≤d2≤13 mm.

In an embodiment, the first busbar and the second busbar have a second width L2 along the second direction, and 0.2 mm≤L2≤0.3 mm.

In an embodiment, the first welding point and the second welding point have a third width L3 along the first direction and/or the second direction, and 1 mm≤L3≤1.3 mm.

In a second aspect, the present application provides a photovoltaic module, which includes a cover plate, a cell string, and an encapsulation layer. The cover plate is located on opposite sides of the cell string, the encapsulation layer is arranged between the cover plate and the cell string, and the cell string is formed by electrically connecting multiple solar cells in the first aspect.

In an embodiment, the photovoltaic module further includes multiple welding strips extending along the first direction, at least one of the multiple welding strips is electrically connected to the first busbar by the first welding point, and at least part of the multiple the welding strips are electrically connected to the second busbar by the second welding point.

Compared with the conventional art, the solar cell and the photovoltaic module provided according to the present application have at least the following beneficial effects.

In the solar cell provided according to the present application, the first electrodes and the second electrodes are arranged in an interdigitated pattern, resulting in a close arrangement of the first fingers and the second fingers. The distance between the first fingers or the second fingers and a busbar with opposite polarity and its welding points is also relatively close. In response to the welding strip having offset during the subsequent welding process between the solar cell and the welding strip, it is easy for the first fingers or the second fingers to come into contact with fingers with opposite polarity around the busbar, which causes a short circuit in the solar cell. Therefore, the present application covers multiple insulation structures in the area where the first busbar and/or the second busbar of the solar cell are located. An end of each of the multiple insulation structures extends to cover ends of the multiple first fingers close to the second busbar and/or ends of the multiple second fingers close to the first busbar. Even if the welding strips have offset during welding, the insulation structures will separate the welding strips from the fingers close to the busbar, which effectively avoids short circuit in the solar cell during the welding process. In addition, a window is opened on a projection of at least one of the busbar and the welding point on a respective insulation structure, which not only left position of the welding points for subsequent welding with the welding strips, but also expose the busbar, so that the amount of insulation structures is reduced, and thereby reducing production costs.

Of course, implementing any aspect of the present application does not necessarily require achieving all the technical effects mentioned above simultaneously.

By following a detailed description of exemplary embodiments of the present application with reference to the accompanying drawings, other features and advantages of the present application will become clear.

BRIEF DESCRIPTION OF THE DRAWINGS

The accompanying drawings, which are incorporated into and form a part of the specification, illustrate embodiments of the present application and are used together with their explanations to explain the principles of the present application.

DETAILED DESCRIPTION

Various exemplary embodiments of the present application will be described in detail with reference to the accompanying drawings. It should be noted that unless otherwise specified, the relative arrangement, numerical expressions, and numerical values of the components and operations described in these embodiments do not limit the scope of the present application.

The following description of at least one exemplary embodiment is actually only illustrative and does not serve as any limitation on the present application or its application or usage.

The techniques, methods, and equipment known to those of ordinary skills in the art may not be discussed in detail, but in appropriate cases, the techniques, methods, and equipment should be considered as part of the specification.

In all the examples shown and discussed here, any specific values should be interpreted as merely illustrative and not as limiting. Therefore, other examples of exemplary embodiments may have different values.

It should be noted that similar labels and letters represent similar terms in the following figures, so once an item is defined in a figure, it does not need to be further discussed in subsequent figures.

In the IBC solar cell, positive metal electrodes and negative metal electrodes of the solar cell are arranged in an interdigitated pattern on the rear surface of the solar cell, and are closely arranged around busbars and welding points. Therefore, there is a risk of short circuit of the solar cell during the welding process of welding strips, which leads to short circuit of the components.

In order to solve the above technical problems, the embodiments of the present application provide a solar cell and a photovoltaic module, which are used to avoid short circuits in the solar cell.

The following is a detailed explanation in conjunction with the accompanying drawings and specific embodiments.

Figure 1:
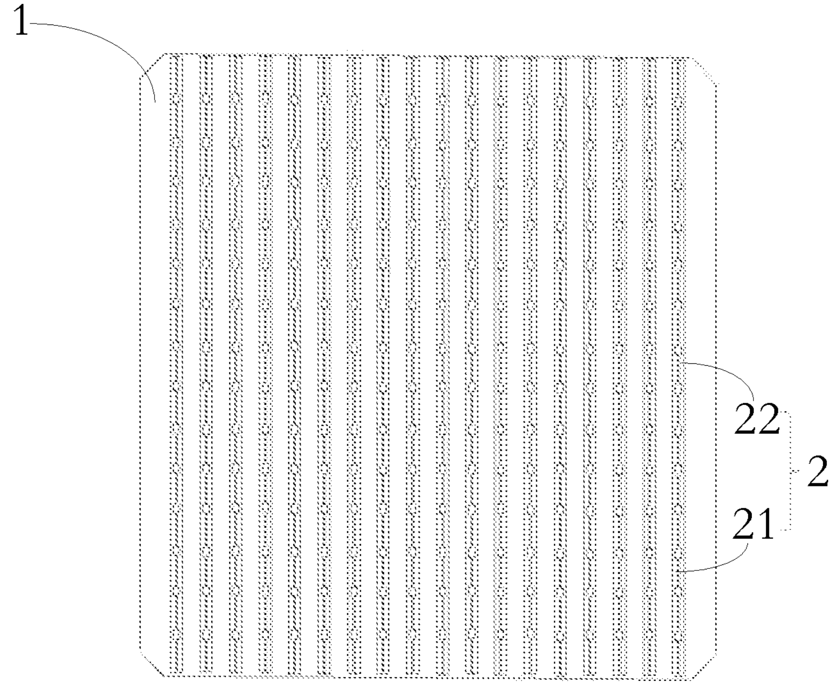
FIG. 1 is a schematic structural view of a first surface of a solar cell provided according to an embodiment of the present application.
Figure 2:
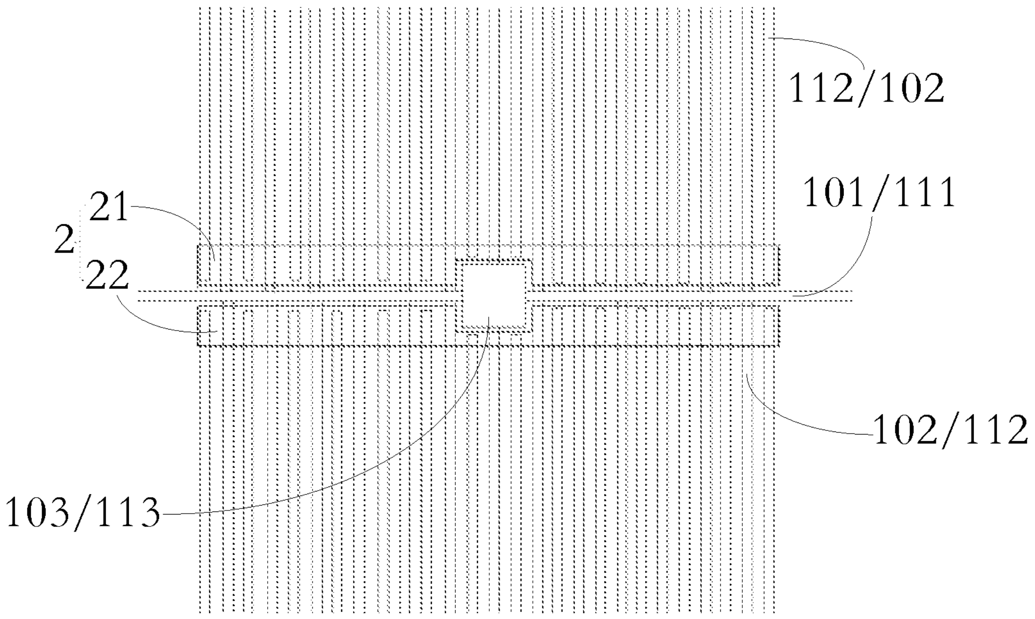
FIG. 2 is a partially enlarged view of FIG. 1.
Figure 3:
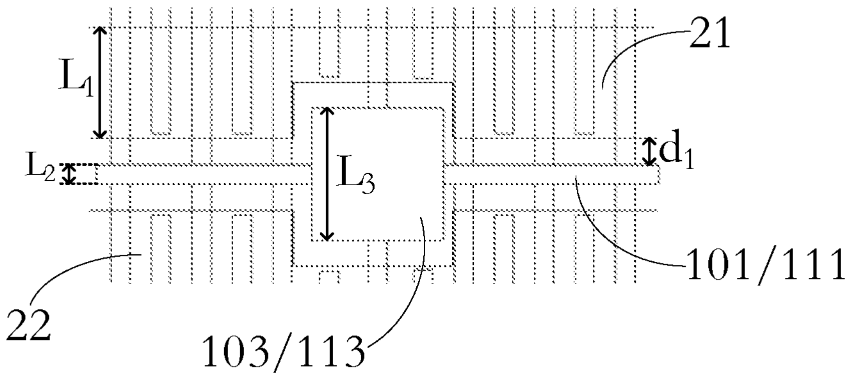
FIG. 3 is a partially enlarged view of FIG. 2.
Figure 4:
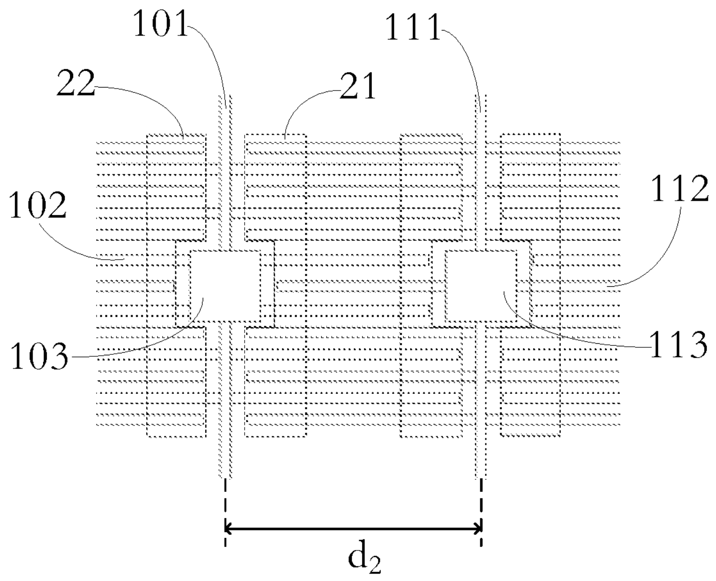
FIG. 4 is another partially enlarged view of FIG. 1.

FIG. 1 is a schematic structural view of a first surface of a solar cell provided according to an embodiment of the present application. FIG. 2 is a partially enlarged view of FIG. 1. FIG. 3 is a partially enlarged view of FIG. 2. FIG. 4 is another partially enlarged view of FIG. 1.

As shown in FIG. 1 to FIG. 4, the embodiments of the present application provide a solar cell 1, where a first surface of the solar cell 1 has multiple first electrodes and multiple second electrodes staggered in an interdigitated pattern. Each of the multiple first electrodes has a first busbar 101 extending along a first direction and multiple first fingers 102 extending along a second direction, each of the multiple second electrodes has a second busbar 111 extending along the first direction and multiple second fingers 112 extending along the second direction, and the first direction is perpendicular to the second direction. A first welding point 103 is defined on the first busbar 101, and a second welding point 113 is defined on the second busbar 111.

The solar cell further includes multiple insulation structures 2 configured to cover an area where the first busbar 101 is located and/or an area where the second busbar 111 is located, an end of each of the multiple insulation structures 2 extends to cover ends of the multiple first fingers 102 close to the second busbar 111 and/or ends of the multiple second fingers 112 close to the first busbar 101.

A window is opened on a projection of at least one of the first busbar 101 and the first welding point 103 on a respective insulation structure 2, and/or a window is opened on a projection of at least one of the second busbar 111 and the second welding point 113 on the respective insulation structure 2.

Based on this, as shown in FIG. 1 to FIG. 4, in the solar cell 1 provided according to the embodiments of the present application, both the first electrodes and the second electrodes are arranged on the first surface of the solar cell 1, that is, the solar cell 1 provided according to the embodiments of the present application is a back contact cell. Among them, the first busbar 101 in the first electrode and the second busbar 111 in the second electrode both extend along the first direction. The first finger 102 in the first electrode and the second finger 112 in the second electrode both extend along the second direction, and the first direction is perpendicular to the second direction. The first electrodes and the second electrodes are arranged in an interdigitated pattern, so that the first fingers 102 and the second fingers 112 are closely arranged, the distance between the first fingers 102 and the second fingers 112 and a busbar with opposite polarity and its welding points is also relatively close. In the subsequent welding process between the solar cell 1 and the welding strips, in response to the welding strips having offset, it is easy for the first fingers 102 or the second fingers 112 to come into contact with fingers with opposite polarity around the busbar, which causes the fingers with different polarities to be connected to the busbar by the welding strips, thereby causing a short circuit in the solar cell 1.

Therefore, the embodiment of the present application covers multiple insulation structures 2 in the area where the first busbar 101 and/or the second busbar 111 of the solar cell 1 are located, and an end of each of the multiple insulation structures 2 extends to cover ends of the multiple first fingers 102 close to the second busbar 111 and/or ends of the multiple second finger 112 close to the first busbar 101, so that the ends of the multiple first fingers 102 and/or the ends of the multiple second fingers 112 close to the busbar with opposite polarity can be covered by the multiple insulation structures 2. In response to the welding strips having offset during welding, the insulation structures 2 will separate the welding strips from the fingers close to the busbar, which avoids contact between the welding strips and the ends of the fingers, thereby achieving insulation effect and effectively preventing short circuit from happening in the solar cell 1 during the welding process. In addition, a window is opened on a projection of at least one of the busbar and the welding point on a respective insulation structure, which not only left position of the welding points for subsequent welding with the welding strips, but also expose the busbar, so that the amount of insulation structures is reduced, and thereby reducing production costs. Secondly, the windows opened for the busbar and welding points can also minimize the impact of the multiple insulation structures 2 on the light transmittance as much as possible.

In some examples, the insulation structures 2 are embodied as high-temperature resistant hot melt insulation films. When in use, the insulation structures 2 are first covered at the corresponding position on the solar cell 1, and then the solar cell 1 together with the insulation structures 2 are heated to the melting temperature of the insulation structures 2, so that the insulation structures 2 can tightly cover the ends of the fingers close to the busbar.

As an example, material of each of the multiple insulation structures 2 includes polyvinyl chloride (PVC) or viscous natural rubber, which is only an example, and is not specifically limited thereto.

As a possible implementation, as shown in FIG. 1 to FIG. 4, each of the multiple insulation structures 2 includes a first insulation portion 21 and a second insulation portion 22, which are distributed on opposite sides of the first busbar 101 and/or the second busbar 111.

Based on this, as shown in FIG. 1 to FIG. 4, each of the multiple insulation structures 2 configured to cover the area where the first busbar 101 is located and/or the area where the second busbar 111 is located is divided into the first insulation portion 21 and the second insulation portion 22, which are respectively arranged on opposite sides of the first busbar 101 and/or the second busbar 111. Within the same insulation structure 2, a position left between the first insulation portion 21 and the second insulation portion 22 is the window opened for the busbar and the welding points on the busbar, which further reduces the usage and production cost of the insulation structure 2 while ensuring normal connection with the welding strips. Furthermore, the impact of the insulation structures 2 on the light transmittance is further reduced. In addition, compared to the method of drilling holes on the insulation structures 2, the first insulation portion 21 and the second insulation portion 22 being separately arranged on both sides of the busbar are easier to operate when covering and laminating.

For example, as shown in FIG. 1 to FIG. 4, the first insulation portion 21 and the second insulation portion 22 can be continuous insulation portions.

In some examples, as shown in FIG. 1 to FIG. 4, the first insulation portion 21 and the second insulation portion 22 extend along the first direction, and there is a first distance d1 between the first insulation portion 21 and the first busbar 101 and between the second insulation portion 22 and the second busbar 102 along the second direction, and 0.2 mm≤d1≤0.4 mm.

Based on this, as shown in FIG. 1 to FIG. 4, in the solar cell 1 provided according to the embodiments of the present application, the first insulation portion 21 and the second insulation portion 22 extend along the same direction as that of the first busbar 101 and the second busbar 111, that is the first direction, which makes the first insulation portion and the second insulation portion to cover and fit the first busbar and the second busbar more conveniently. Along the second direction, the first insulation portion 21 and the second insulation portion cover the ends of the first fingers 102 and the second fingers 112 close to the busbar, while maintaining a width d1 from the busbar, so that the insulation structures 2 can completely cover the ends of the fingers close to the busbar for insulation and avoid direct contact with the insulation film during welding. The width of the welding strip should be less than the distance between the first insulation portion 21 and the second insulation portion 22. In response to the first distance d1 being too small, the distance between the insulation structures 2 and the busbar is too small. During subsequent welding, the welding strips are easy to be in contact with the insulation structures 2, which has an impact on the welding quality. In response to the first distance d1 being too large, the distance between the insulation structures 2 and the ends of the fingers is too small, which makes it difficult for the insulation structures 2 to fully cover the ends of the fingers, thereby affecting the insulation effect.

As an example, first distance d1 between the first insulation portion 21 and the first busbar 101 and between the second insulation portion 22 and the second busbar 102 along the second direction may be 0.2 mm, 0.25 mm, 0.3 mm, 0.35 mm, 0.4 mm, which are only examples, and are not specifically limited thereto.

In some examples, as shown in FIG. 1 to FIG. 4, the first insulation portion 21 and the second insulation portion 22 have a first width L1 along the second direction, and 0.9 mm≤L1≤1.1 mm.

Based on this, as shown in FIG. 1 to FIG. 4, in the solar cell provided according to the embodiments of the present application, the first insulation portion 21 and the second insulation portion 22 also have a first width L1 along the second direction. After the first distance d1 between a side of the first insulation portion 21 close to the busbar and the busbar, or between a side of the second insulation portion 22 close to the busbar and the busbar is ensured to be within an appropriate range, the first width L1 represents the distance between a side of the first insulation portion 21 away from the busbar and the busbar, or between a side of the second insulation portion 22 away from the busbar and the busbar. In response to the first width L1 of the first insulation portion 21 and the second insulation portion 22 along the second direction being too large, the amount of insulation structures is too much, resulting in cost waste. Considering that the finger itself is at a certain distance from the busbar, in response to the first width L1 of the first insulation portion 21 and the second insulation portion 22 along the second direction being too small, it is difficult to ensure that the first insulation portion 21 and the second insulation portion 22 can fully cover the ends of the fingers close to the busbar, and it is difficult to ensure the insulation effect.

As an example, the first width L1 of the first insulation portion 21 and the second insulation portion 22 along the second direction may be 0.9 mm, 0.95 mm, 1.0 mm, 1.05 mm, 1.1 mm, which are only examples, and are not specifically limited thereto.

As a possible implementation, as shown in FIG. 1 to FIG. 4, the insulation structures 2 are configured to cover an end of each of the multiple first fingers 102 close to the second welding point 113 and/or an end of each of the multiple second fingers 112 close to the first welding point 103. The first insulation portion 21 and the second insulation portion 22 are distributed on opposite sides of the first welding point 103 and/or the second welding point 113.

Based on this, as shown in FIG. 1 to FIG. 4, in the solar cell 1 provided according to the embodiments of the present application, the insulation structures 2 are configured to cover an end of each of the multiple first fingers 102 close to the second welding point 113 and/or an end of each of the multiple second fingers 112 close to the first welding point 103, which achieves insulation at the ends of the finger without obstructing the welding point, while ensuring the welding effect and avoiding short circuit in the solar cell 1 during the welding process. The way to open a window for the welding point on the insulation structures 2 can be the same as that on the busbar, that is, the insulation structure 2 is divided into two parts: the first insulation portion 21 and the second insulation portion 22, which are arranged on opposite sides of the welding point. The first insulation portion 21 and the second insulation portion 22 on both sides of the welding point and the busbar are continuous insulation structures 2, that is, the first insulation portion 21 and the second insulation portion 22 on the opposite sides of the same busbar and its welding points extend continuously along the first direction, which further reduces the difficulty of operation and improves production efficiency. The distance between the first insulation portion 21 or the second insulation portion 22 and the welding point can refer to the first distance d1 between the first insulation portion 21 or the second insulation portion 22 and the busbar, which will not be repeated here.

As a possible implementation, as shown in FIG. 1 to FIG. 4, along the second direction, the first busbar 101 and the second busbar 111 are evenly spaced, there is a distance d2 from the first busbar 101 and an adjacent second busbar 111, and 9 mm≤d2≤13 mm.

Based on this, as shown in FIG. 1 to FIG. 4, in the solar cell 1 provided according to the embodiments of the present application, the first busbar 101 and the second busbar 111 are evenly spaced along the second direction, so that the multiple first fingers 102 connected to the first busbar 101 and the multiple second fingers 112 connected to the second busbar 111 are arranged in an interdigitated pattern. There is a distance d2 from the first busbar 101 and an adjacent second busbar 111, and 9 mm≤d2≤13 mm. In response to the second distance d2 from the first busbar 101 and an adjacent second busbar 111 along the second direction between being less than 9 mm, the distance between the busbars is too small, and the number of busbars also increases accordingly. The shading area increases, which affects the absorption of light by the solar cell 1 and also increases the consumption of silver slurry, resulting in an increase in production costs. In response to the second distance d2 from the first busbar 101 and an adjacent second busbar 111 along the second direction between being greater than 13 mm, the distance between the busbars is too large, and the length of the finger along the second direction correspondingly increases, resulting in an increase in series resistance, which has a negative impact on the efficiency of the solar cell 1.

As an example, the distance d2 from the first busbar 101 and an adjacent second busbar 111 may be 9 mm, 10 mm, 11 mm, 12 mm, 13 mm, which are only examples, and are not specifically limited thereto.

As a possible embodiment, as shown in FIG. 1 to FIG. 4, the first busbar 101 and the second busbar 111 have a second width L2 along the second direction, and 0.2 mm≤L2≤0.3 mm.

Based on this, as shown in FIG. 1 to FIG. 4, in the solar cell 1 provided according to the embodiments of the present application, the first busbar 101 and the second busbar 111 have a second width L2 along the second direction, and 0.2 mm≤L2≤0.3 mm. In response to the second width L2 of the first busbar 101 and the second busbar 111 in the second direction being less than 0.2 mm, the first busbar 101 and the second busbar 111 are too fine, which is not conducive to the collection of carriers by the multiple first fingers 102 and the multiple second fingers 112, and will also affect the reliability of the solar cells and the photovoltaic modules. In response to the second width L2 of the first busbar 101 and the second busbar 111 along the second direction being greater than 0.3 mm, the first busbar 101 and the second busbar 111 are too wide, which increases the shading area of the busbar and affects the absorption of light by the solar cell 1, resulting in a decrease in the power of the solar cell. Moreover, an excessively wide busbar also increases production costs.

As an example, the second width L2 of the first busbar 101 and the second busbar 111 along the second direction may be 0.2 mm, 0.21 mm, 0.25 mm, 0.28 mm, or 0.3 mm, which are only examples, and are not specifically limited thereto.

As a possible embodiment, as shown in FIG. 1 to FIG. 4, the first welding point 103 and the second welding point 113 have a third width L3 along the first direction and/or the second direction, and 1 mm≤L3≤1.3 mm.

Based on this, as shown in FIG. 1 to FIG. 4, in the solar cell 1 provided according to the embodiments of the present application, the first welding point 103 and the second welding point 113 have a third width L3 along the first direction and/or the second direction, and 1 mm≤L3≤1.3 mm. In response to the third width L3 of the first welding point 103 and the second welding point 113 along the first direction and/or the second direction being less than 1 mm, the first welding point 103 and the second welding point 113 is too small, and there may be a problem with the tensile force when welding with the welding strip, which affects the welding effect and reliability. In response to the third width L3 of the first welding point 103 and the second welding point 113 along the first direction and/or the second direction being greater than 1.3 mm, the first welding point 103 and the second welding point 113 is too large, resulting in an increase in production costs.

As an example, the third width L3 of the first welding point 103 and the second welding point 113 along the first direction and/or the second direction may be 1 mm, 1.15 mm, 1.2 mm, 1.25 mm, or 1.3 mm, which are only examples, and are not specifically limited thereto.

Figure 5:
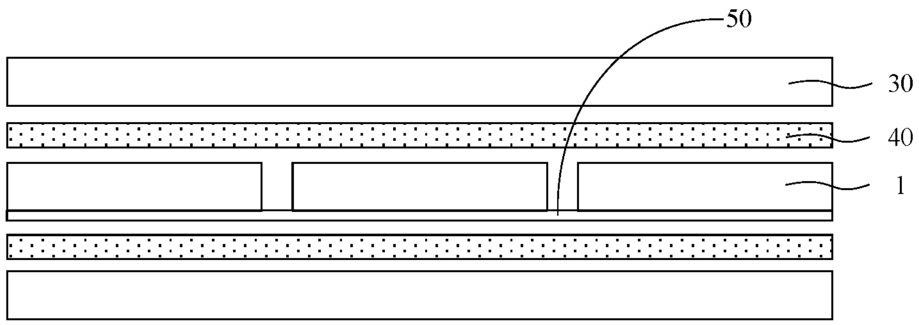
FIG. 5 is a schematic structural view of a photovoltaic module provided according to an embodiment of the present application.

FIG. 5 is a schematic structural view of a photovoltaic module provided according to an embodiment of the present application.

Based on the same invention concept, as shown in FIG. 5, a photovoltaic module is further provided according to the present application, which includes a cover plate 30, a cell string, and an encapsulation layer 40. The cover plate 30 is located on opposite sides of the cell string, and the encapsulation layer 40 is arranged between the cover plate 30 and the cell string. The cell string is formed by electrically connecting multiple solar cells as described in the first aspect together.

Compared with existing the conventional art, the photovoltaic module has the same beneficial effects as the solar cell described in the above embodiments, and will not be further elaborated here.

As shown in FIG. 5, the photovoltaic module includes a cell string, which is formed by connecting multiple solar cells 1 provided according to the above embodiments. The encapsulation layer 40 is configured to cover a surface of the cell string, and the cover plate 30 is configured to cover a surface of the encapsulation layer 40 away from the cell string. Multiple solar cells 1 are electrically connected in whole or multiple pieces to form multiple cell strings, which are electrically connected in series and/or parallel.

Specifically, in some embodiments, as shown in FIG. 5, multiple cell strings are electrically connected by a welding strip 50. The encapsulation layer 40 is configured to cover the front surface and the rear surface of the solar cell 1. Specifically, the encapsulation layer 40 may be embodied as an organic packaging adhesive film, such as ethylene vinyl acetate copolymer (EVA) film, polyethylene octene co-elastomer (POE) film, or polyethylene terephthalate (PET) film. In some embodiments, the cover plate 30 may be embodied as a glass cover plate, a plastic cover plate, or other cover plates with light transmission function. Specifically, the surface of the cover plate 30 facing toward the encapsulation layer 40 may be a surface with protrusions and recesses, thereby increasing the utilization of incident light.

As a possible embodiment, the photovoltaic module further includes multiple welding strips 50 extending along the first direction, at least some of which are electrically connected to the first busbar 101 through the first welding point 103, and at least some of which are electrically connected to the second busbar 111 through the second welding point 113.

Based on this, the welding strips 50 included in the photovoltaic module are electrically connected to the first busbar 101 by being in contact with the first welding point 103, and to the second busbar 111 by being in contact with the second welding point 113, thereby achieving electrical connection to the solar cell 1, and facilitating the transmission of carriers collected by the multiple first fingers 102 and the multiple second fingers 112. In response to the welding strips 50 being welded to the welding point, the insulation structure 2 on the solar cell 1 can completely cover the ends of the fingers close to the busbar and the welding point, which effectively avoid direct contact between the fingers of the solar cell 1 and in response to the welding strips 50 having offset, thereby achieving insulation effect and effectively avoiding short circuits in the solar cell 1.

In summary, the solar cell and the photovoltaic module provided according to the present application have at least the following beneficial effects.

In the solar cell provided according to the present application, the first electrodes and the second electrodes are arranged in an interdigitated pattern, resulting in a close arrangement of the first fingers and the second fingers. The distance between the first fingers or the second fingers and a busbar with opposite polarity and its welding points is also relatively close. In response to the welding strip having offset during the subsequent welding process between the solar cell and the welding strip, it is easy for the first fingers or the second fingers to come into contact with fingers with opposite polarity around the busbar, which causes a short circuit in the solar cell. Therefore, the present application covers multiple insulation structures in the area where the first busbar and/or the second busbar of the solar cell are located. An end of each of the multiple insulation structures extends to cover ends of the multiple first fingers close to the second busbar and/or ends of the multiple second fingers close to the first busbar. Even if the welding strips have offset during welding, the insulation structures will separate the welding strips from the fingers close to the busbar, which effectively avoids short circuit in the solar cell during the welding process. In addition, a window is opened on a projection of at least one of the busbar and the welding point on a respective insulation structure, which not only left position of the welding points for subsequent welding with the welding strips, but also expose the busbar, so that the amount of insulation structures is reduced, and thereby reducing production costs. Moreover, the insulation structures that can directly cover and adhere to the solar cell can reduce operation difficulty requirements, which is conducive to improving production efficiency.

Although some specific embodiments of the present application have been explained in detail through examples, those skilled in the art should understand that the above examples are only for illustration and not to limit the scope of the present application. Those skilled in the art should understand that the above embodiments can be modified without departing from the scope and spirit of the present application. The scope of the present application is limited by the appended set of claims.

What is claimed is:

1. A solar cell, comprising:

a plurality of first electrodes and a plurality of second electrodes on a first surface of the solar cell, wherein a respective first electrode of the plurality of first electrodes has a first busbar extending along a first direction and a plurality of first fingers extending along a second direction, a respective second electrode of the plurality of second electrodes has a second busbar extending along the first direction and a plurality of second fingers extending along the second direction, and the first direction is perpendicular to the second direction, the first busbar having a first welding point, and the second busbar having a second welding point; wherein the plurality of first fingers and the plurality of second fingers are staggered in an interdigitated pattern; and a plurality of insulation structures including first insulation structures in one-to-one correspondence with the first busbars of the plurality of first electrodes and second insulation structures in one-to-one correspondence with the second busbars of the plurality of second electrodes, a respective first insulation structure of the first insulation structures being configured to cover an area near a corresponding first busbar to cover ends of second fingers on opposite sides of the corresponding first busbar, wherein the plurality of second fingers include a first subset of second fingers on a first side of the opposite sides of the corresponding first busbar and a second subset of second fingers on a second side of the opposite sides of the corresponding first busbar, the first subset of second fingers having ends facing and spaced apart from the first side of the corresponding first busbar, the second subset of second fingers having ends facing and spaced apart from the second side of the corresponding first busbar, the ends of the first subset of second fingers and the ends of the second subset of second fingers being covered by the respective first insulation structure, a respective second insulation structure of the second insulation structures being configured to cover an area near a corresponding second busbar to cover ends of first fingers on opposite sides of the corresponding second busbar, wherein the plurality of first fingers include a first subset of first fingers on a first side of the opposite sides of the corresponding second busbar and a second subset of first fingers on a second side of the opposite sides of the corresponding second busbar, the first subset of first fingers having first ends, the second subset of first fingers having second ends that are spaced apart from the first ends by the corresponding second busbar, the first ends and the second ends being covered by the respective second insulation structure;

wherein the respective first insulation structure has a window that exposes the corresponding first busbar and the first welding point of the corresponding first busbar; and wherein the respective second insulation structure has a window that exposes the corresponding second busbar and the second welding point of the corresponding second busbar, wherein a respective insulation structure of the plurality of insulation structures comprises a first insulation portion and a second insulation portion arranged on opposite sides of a corresponding first or second busbar and spaced apart from the corresponding first or second busbar, wherein the first insulation portion and the second insulation portion of the respective insulation structure extend continuously in the first direction and sandwich the first or second welding point of the corresponding first or second busbar.

2. The solar cell according to claim 1, wherein the first insulation portion and the second insulation portion have a first width L1 along the second direction, and 0.9 mm≤L1≤1.1 mm.

3. The solar cell according to claim 1, wherein the first busbar and the second busbar are evenly spaced along the second direction, and there is a second distance d2 between the first busbar and an adjacent second busbar, and 9 mm≤d2≤13 mm.

4. The solar cell according to claim 1, wherein the first busbar and the second busbar have a second width L2 along the second direction, and 0.2 mm≤L2≤0.3 mm.

5. The solar cell according to claim 1, wherein the first welding point and the second welding point have a third width L3 along the first direction and/or the second direction, and 1 mm≤L3≤1.3 mm.

6. The solar cell according to claim 1, wherein the plurality of insulation structures are hot melt insulation films.

7. A photovoltaic module, comprising a cover plate, a cell string, and an encapsulation layer, wherein the cover plate is located on opposite sides of the cell string, the encapsulation layer is arranged between the cover plate and the cell string, and the cell string is formed by electrically connecting a plurality of solar cells;

a respective solar cell of the plurality of solar cells includes:

a plurality of first electrodes and a plurality of second electrodes on a first surface of the solar cell, wherein a respective first electrode of the plurality of first electrodes has a first busbar extending along a first direction and a plurality of first fingers extending along a second direction, a respective second electrode of the plurality of second electrodes has a second busbar extending along the first direction and a plurality of second fingers extending along the second direction, and the first direction is perpendicular to the second direction, the first busbar having a first welding point, and the second busbar having a second welding point; wherein the plurality of first fingers and the plurality of second fingers are staggered in an interdigitated pattern; and a plurality of insulation structures including first insulation structures in one-to-one correspondence with the first busbars of the plurality of first electrodes and second insulation structures in one-to-one correspondence with the second busbars of the plurality of second electrodes, a respective first insulation structure of the first insulation structures being configured to cover an area near a corresponding first busbar to cover ends of second fingers on opposite sides of the corresponding first busbar, wherein the plurality of second fingers include a first subset of second fingers on a first side of the opposite sides of the corresponding first busbar and a second subset of second fingers on a second side of the opposite sides of the corresponding first busbar, the first subset of second fingers having ends facing and spaced apart from the first side of the corresponding first busbar, the second subset of second fingers having ends facing and spaced apart from the second side of the corresponding first busbar, the ends of the first subset of second fingers and the ends of the second subset of second fingers being covered by the respective first insulation structure, a respective second insulation structure of the second insulation structures being configured to cover an area near a corresponding second busbar to cover ends of first fingers on opposite sides of the corresponding second busbar, wherein the plurality of first fingers include a first subset of first fingers on a first side of the opposite sides of the corresponding second busbar and a second subset of first fingers on a second side of the opposite sides of the corresponding second busbar, the first subset of first fingers having first ends, the second subset of first fingers having second ends that are spaced apart from the first ends by the corresponding second busbar, the first ends and the second ends being covered by the respective second insulation structure;

wherein the respective first insulation structure has a window that exposes the corresponding first busbar and the first welding point of the corresponding first busbar; and wherein the respective second insulation structure has a window that exposes the corresponding second busbar and the second welding point of the corresponding second busbar, wherein a respective insulation structure of the plurality of insulation structures comprises a first insulation portion and a second insulation portion arranged on opposite sides of a corresponding first or second busbar and spaced apart from the corresponding first or second busbar, wherein the first insulation portion and the second insulation portion of the respective insulation structure extend continuously in the first direction and sandwich the first or second welding point of the corresponding first or second busbar.

8. The photovoltaic module according to claim 7, further comprising a plurality of welding strips extending along the first direction, at least part of the plurality of welding strips are electrically connected to the first busbar by the first welding point, and at least part of the plurality of the welding strips are electrically connected to the second busbar by the second welding point.

9. The photovoltaic module according to claim 7, wherein the encapsulation layer is an ethylene vinyl acetate copolymer (EVA) film, a polyethylene octene co-elastomer (POE) film, or a polyethylene terephthalate (PET) film.

10. The photovoltaic module according to claim 7, wherein the first busbar and the second busbar are evenly spaced along the second direction, and there is a second distance d2 between the first busbar and an adjacent second busbar, and 9 mm≤d2≤13 mm.

* * * * *